(12) United States Patent
Kim et al.

(10) Patent No.: US 10,749,715 B2
(45) Date of Patent: Aug. 18, 2020

(54) SYSTEMS AND METHODS FOR CABLE HEADEND TRANSMISSION

(71) Applicant: Avago Technologies International Sales Pte. Limited, Singapore (SG)

(72) Inventors: Tae Youn Kim, Irvine, CA (US); Loke K. Tan, Irvine, CA (US); Lin He, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/132,124

(22) Filed: Sep. 14, 2018

(65) Prior Publication Data

US 2019/0349227 A1 Nov. 14, 2019

Related U.S. Application Data

(60) Provisional application No. 62/669,945, filed on May 10, 2018.

(51) Int. Cl.
| | | |
|---|---|---|
| H04L 25/03 | (2006.01) |
| H03F 3/24 | (2006.01) |
| H03F 3/19 | (2006.01) |
| H03F 1/02 | (2006.01) |
| H04B 3/14 | (2006.01) |
| H03F 1/32 | (2006.01) |

(52) U.S. Cl.
CPC ......... *H04L 25/03885* (2013.01); *H03F 1/02* (2013.01); *H03F 1/3241* (2013.01); *H03F 3/19* (2013.01); *H03F 3/245* (2013.01); *H04B 3/14* (2013.01); *H03F 2200/129* (2013.01); *H03F 2200/453* (2013.01)

(58) Field of Classification Search
CPC ... H04L 25/03885; H03F 1/3241; H03F 1/02; H03F 3/19; H03F 3/245; H03F 2200/453; H03F 2200/129; H04B 3/14
See application file for complete search history.

(56) References Cited

U.S. PATENT DOCUMENTS

| | | | |
|---|---|---|---|
| 2002/0116182 A1* | 8/2002 | Gao | G10L 19/265 704/205 |
| 2010/0189042 A1* | 7/2010 | Pan | H04B 1/036 370/328 |
| 2017/0104502 A1 | 4/2017 | Pratt | |
| 2018/0226932 A1* | 8/2018 | Beaudin | H04B 1/18 |

OTHER PUBLICATIONS

W. Tai and D. S. Ricketts, "A Q-band power amplifier with high-gain pre-driver and 18.7 dBm output power for fully integrated CMOS transmitters," 2014 IEEE Topical Conference on Power Amplifiers for Wireless and Radio Applications (PAWR), Newport Beach, CA, 2014, pp. 34-36. (Year: 2014).*

* cited by examiner

*Primary Examiner* — Nader Bolourchi
(74) *Attorney, Agent, or Firm* — Foley & Lardner LLP (57) ABSTRACT

Systems and methods for cable transmission are provided. The system includes an up-tilt circuit, a digital-to-analog converter, and a power amplifier. The up-tilt circuit is configured to receive an input digital signal that has a flat spectrum and generate an up-tilted digital signal that has an up-tilted spectrum. The digital-to-analog converter is configured to receive the up-tilted digital signal and to provide an analog signal. The power amplifier is configured to receive the analog signal and amplify the analog signal for cable transmission.

15 Claims, 5 Drawing Sheets

SYSTEMS AND METHODS FOR CABLE HEADEND TRANSMISSION

CROSS-REFERENCE TO RELATED PATENT APPLICATIONS

This application claims priority from U.S. Provisional Application No. 62/669,945, filed May 10, 2018, incorporated herein by reference in its entirety.

FIELD OF THE DISCLOSURE

The present disclosure relates generally to the field of communication including but not limited to field of systems and methods for cable headend or fiber node transmission.

BACKGROUND

Communications over cable are conducted in part by transmitting signals through cable paths from a head node to one or more end nodes. A non-segmented transmission scheme is used for cable headend transmission system applications or downstream cable mode termination system applications. The non-segmented transmission scheme splits a single signal (e.g., a radio frequency (RF) signal) stream into multiple separate paths to feed multiple separate power amplifiers (PAs). Each of the signal streams is further transmitted to a respective cable plant.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Before turning to the features, which illustrate the exemplary embodiments in detail, it should be understood that the application is not limited to the details or methodology set forth in the description or illustrated in the figures. It should also be understood that the terminology is for the purpose of description only and should not be regarded as limiting.

Referring generally to the figures, systems and methods for conducting high-performance, low power, and low-cost cable headend transmission are shown according to various exemplary embodiments. In a cable network, a large number of remote fiber nodes can be deployed nationwide on curbsides to service nearby residents and businesses. Each fiber node is often enclosed in a metal housing with limited thermal dissipation capacity. Accordingly, reduction in power consumption at the cable headend is advantageous.

Super high output headend or fiber nodes generally employ a non-segmented transmission scheme that splits a single analog signal (e.g., a radio frequency (RF) signal stream) from a single source (e.g., a transmit digital-to-analog converter (TX DAC)) into multiple separate signals to feed multiple separate PAs on separate paths. The use of a single TX DAC for multiple streams and the use of less than one pre-driver and linear equalizer for each PA across the multiple paths in the non-segmented transmission scheme save total power consumption and component expense.

In contrast to the non-segmented transmission scheme, a segmented transmission scheme provides a separate signal path from the TX DAC to each PA. Each separate path of the segmented transmission scheme includes the TX DAC, two analog linear equalizers, one or more pre-drivers, and a PA. The use of two analog equalizers and one or more pre-drivers per path can increase power consumption and component count across multiple paths when compared to the non-segmented transmission scheme. Conventional segmented schemes require a relatively strong pre-driver (e.g., 6 W or more) to amplify the signal in light of insertion losses related to the two analog linear equalizers.

The largest power consuming components in the segmented and non-segmented transmission schemes are the power amplifiers (PAs), each of which drives an independent cable plant. Bias current on a PA can be reduced to save power consumption. However, reducing bias current can result degradation in linearity performance. The degradation can be ameliorated by employing a digital pre-distortion (DPD) technique. The DPD technique includes a feedback loop to monitor a PA output and applies pre-distorted signal to the TX DAC. The pre-distorted signal is tailored for the particular PA to which the feedback loop is connected.

In a non-segmented transmission scheme where the single TX DAC drives multiple paths, the DPD technique only applies the feedback from a single PA to the TX DAC. In this case, the remaining PAs do not have closed DPD loops and receive pre-distorted signals that are optimized for a different PA. Therefore, the feedback to the TX DAC may not result in reduction of distortion for the remaining PAs and may, in fact, cause further distortion of the signal on the paths of the remaining PAs. In some embodiments and in contrast to the non-segmented transmission scheme, a segmented transmit scheme enables a closed DPD loop for each PA so that each PA can receive a dedicated pre-distorted signal which provides advantages over conventional non-segmented systems that use the DPD technique.

In some embodiments, the systems and methods described herein advantageously reduce power consumption in each fiber node or headend to reduce service cost and allow cable operators to reduce power consumption. In some embodiments, the systems and methods utilize a segmented transmission scheme that transmits analog signals on separate transmission paths. In some embodiments, the system and methods reduce bias current on each PA by employing a DPD loop in each transmission path. In some embodiments, the systems and methods up-tilt signals in the digital domain to eliminate the need for large linear equalizers and a strong pre-driver in the analog domain, thereby reducing insertion losses by the linear equalizers and/or reducing power consumption by the strong pre-driver. In some embodiments, the systems and methods use a weaker pre-driver and a smaller analog filter than the stronger pre-driver and the large analog linear equalizers used in conventional systems to achieve lower-power consumption and lower cost. In some embodiments, the weaker pre-driver consumes less than 5 W (e.g., less than 1.8 W) and has a gain of less than 25 dB gain (e.g., less than 20 dB gain). In some embodiments, the smaller analog filter has an up-tilt characteristic of less than 12 dB up-tilt (e.g., less than 7 dB up-tilt) and an insertion loss of less than 5 dB (e.g. less than 2.5 dB).

In some embodiments, the systems and methods use a four way segmented transmission scheme, which includes four separate paths each including a TX DAC, a digital up tilt circuit and a PA and yet achieves lower power consumption than a non-segmented TX scheme. In some embodiments, the signal in each TX path has an up-tilt (e.g., 22 dB across 1.2 GHz signal bandwidth) at an output of the PA to compensate for frequency-dependent attenuation of a cable plant. In some embodiments, the systems and methods disclosed herein implement the entire up-tilt for each TX path in the digital domain. In some embodiments, the path includes a weak pre-driver and small passive analog filter or linear equalizer in the analog domain.

Some embodiments relate to a system for cable transmission. The system includes an up-tilt circuit, a digital-to-analog converter, and a power amplifier. The up-tilt circuit is configured to receive an input digital signal that has a flat spectrum and generates an up-tilted digital signal that has an up-tilted spectrum. The digital-to-analog converter is configured to receive the up-tilted digital signal and to provide an analog signal. The power amplifier is configured to receive the analog signal and amplify the analog signal for cable transmission. The analog signal is not further up-tilted in an analog domain between the digital-to-analog converter and the power amplifier.

Some embodiments relate to a device for cable transmission. The device includes an up-tilt circuit configured to receive an input digital signal that has a flat spectrum and generate an up-tilted digital signal that has an up-tilted spectrum, a digital-to-analog converter configured to receive the up-tilted digital signal and to provide an analog signal, and an analog filter configured to receive the analog signal, compensate for a roll off characteristic of the digital-to-analog converter, and provide a filtered signal. The analog filter has an insertion loss of less than 2.5 dB, and the up-tilt circuit and the analog filter provide a combined up-tilt response for an entire transmission path of the device. The device also includes a pre-driver configured to amplify the filtered signal and provide a pre-driven signal. The pre-driver has a gain of less than 20 dB. The device also includes a power amplifier configured to receive the pre-driven signal and amplify the pre-driven signal for cable transmission.

Some embodiments relate to a method for cable transmission on transmission paths. Each path is from a cable headend to a cable plant. The method includes up-tilting a digital signal, by one or more circuits in each of the transmission paths, from a flat spectrum to an up-tilted spectrum in a digital domain, converting the digital signal to an analog signal with the up-tilted spectrum in each of the transmission paths, and providing the analog signal to a power amplifier for cable transmission in each of the transmission paths. The up-tilted spectrum is all of the up-tilt that is provided in the transmission path or additional up-tilt is provided by an analog filer in each path. The additional up-tilt includes compensation for DAC roll off incurred during the converting step. The DAC rolloff can also be compensated either in full or partly in the digital domain in some embodiments.

Figure 1:
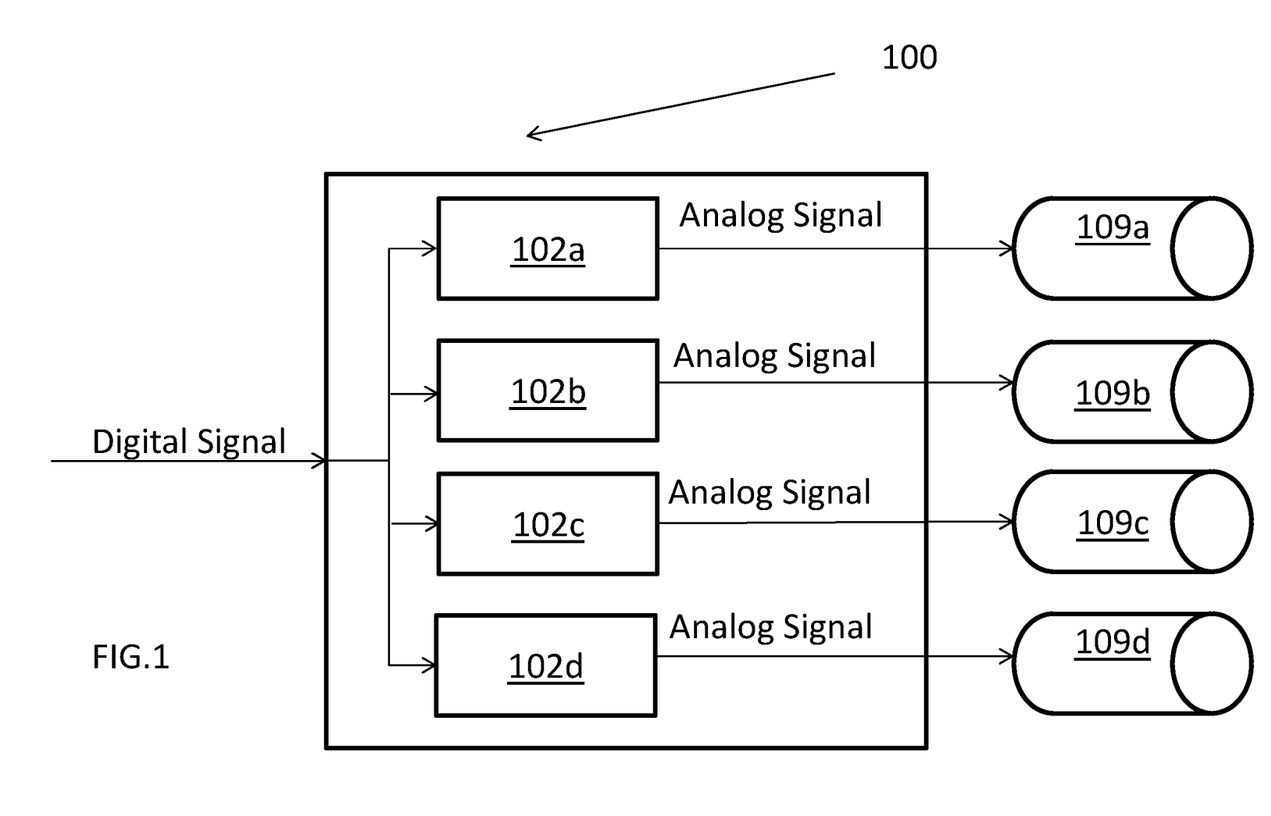
FIG. 1 is a general schematic block diagram of a segmented transmission system for providing cable headend transmission according to some embodiments.

With reference to FIG. 1, a segmented transmission system 100 provides cable headend transmission. The system 100 converts a digital signal to multiple analog signals for transmission to multiple cable plants 109a-d through multiple (e.g., four) transmission paths 102a, 102b, 102c, and 102d. In some embodiments, the system 100 provides all of the up-tilt operations in a digital domain as discussed in more detail below with reference to FIG. 2.

In some embodiments, the system 100 provides up-tilt in the digital domain and upward frequency shaping in the analog domain as discussed in more detail below with reference to FIG. 2. In some embodiments, the system 100 provides compensation for thermal effects in each of the paths 102a-d as discussed in more detail below with reference to FIGS. 3 and 4. In some embodiments, the system 100 provides a DPD loop in each of the paths 102a-d as discussed in more detail below with reference to FIG. 4.

Figure 2:
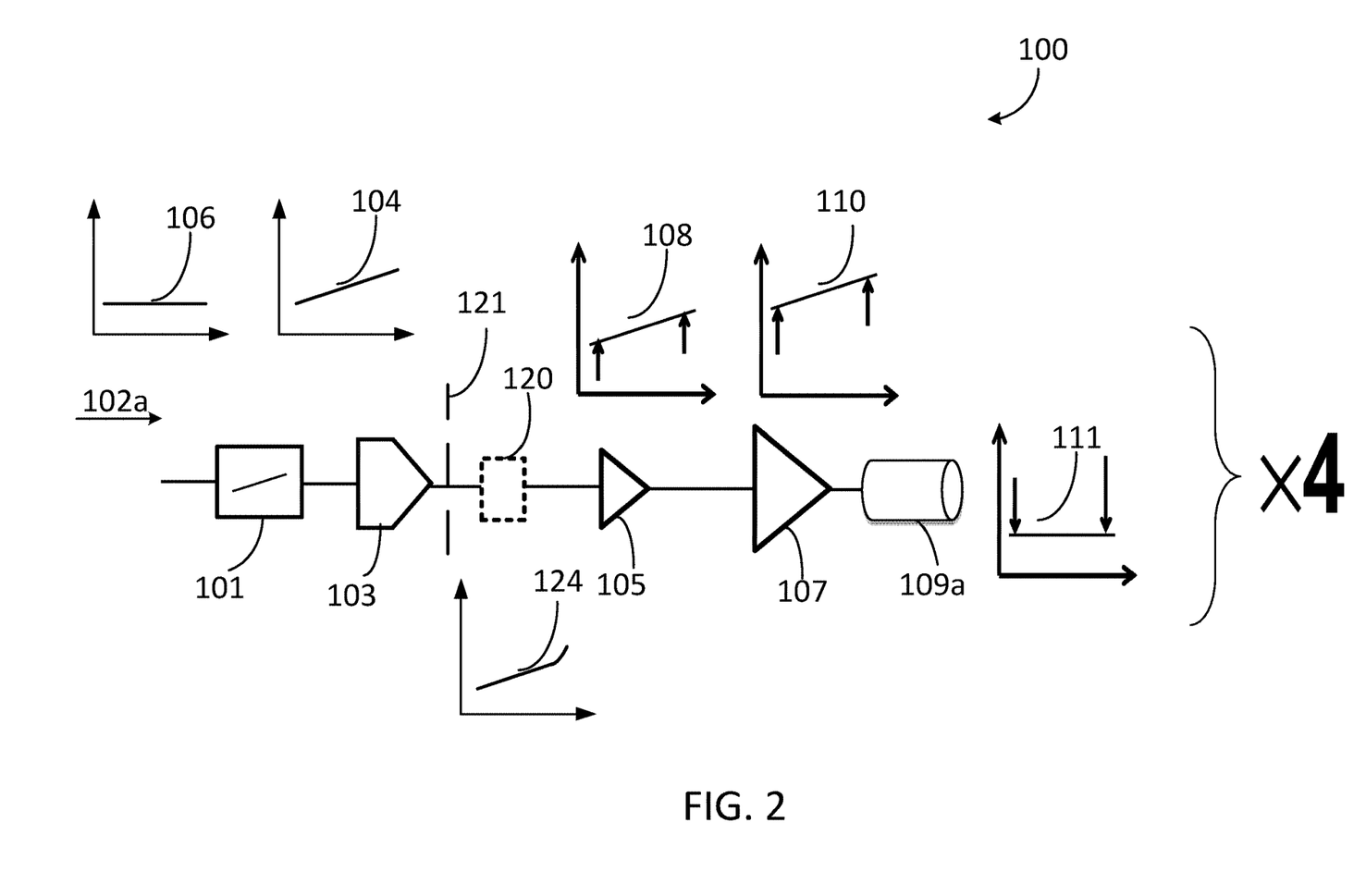
FIG. 2 is a schematic block diagram of a transmission path including a digital up-tilt circuit for the segmented transmission system illustrated in FIG. 1 according to some embodiments.

With reference to FIG. 2, a transmission path 102a of the system 100 includes a digital up-tilt circuit 101, a TX DAC 103, a pre-driver 105, a PA 107, a cable plant 109a, and an optional frequency selective attenuator or analog filter 120 according to some embodiments. The transmission paths 102b-d are similar to the transmission path 102a.

In some embodiments, the transmission path 102a receives a digital input signal with a flat spectrum 106 (where the X-axis is frequency and the Y-axis is power level). The digital input signal is up-tilted by the digital up-tilt circuit 101 according to a spectrum 104 to compensate for a frequency-dependent signal loss at the cable plant 109a. In some embodiments, the up-tilt circuit 101 can implement a strong up-tilt (e.g., 20 dB) to the input digital signal. In some embodiments, the up-tilt circuit 101 can be implemented in a frequency selective digital filter having a response corresponding to the up-tilt characteristic desired at the output of the PA 107. The frequency selective digital filter is implemented in hardware or a combination of hardware and software (e.g., a programmed digital signal processor). In some embodiments, the up-tilt circuit 101 provides as much of the desired up tilt as feasible given the signal-to noise ratio requirements for the channels at the lower end of the spectrum and the dynamic range of the TX DAC 103.

The up-tilted digital input signal is converted to an analog signal by the TX DAC 103 for transmission in the analog domain, which has a border represented by a dashed line 121. In some embodiments, the TX DAC 103 can be any suitable digital-to-analog converter (e.g., a current steering, class-A analog to digital converter). The analog signal from the TX DAC 103 has an up-tilted spectrum 104 that matches the desired up-tilt provided by the PA 107 in some embodiments. In some embodiments, without the use of the optional linear equalizer or analog filter 120, the up-tilt provided by the digital up-tilt circuit 101 provides all of the up-tilt adjustment for the transmission path 102a. In some embodiments, a TX DAC 103 with a large dynamic range with low thermal and quantization noise characteristics is more suitable for paths 102a-d which do not include the optional analog filter 120 (e.g., paths where 100 percent of the up-tilt can be made in the digital domain).

The analog signal from the TX DAC 103 is provided directly to the PA 107 when a power level of the analog signal is enough to drive the PA 107 in some embodiments. In some embodiments, the analog signal from the TX DAC 103 is provided to the pre-driver 105 (e.g., when the power level of the analog signal is not enough to drive the PA 107 directly). The pre-driver 105 amplifies the power level of the analog signal from the TX DAC 103 according to the spectrum 108. In some embodiments, the pre-driver 105 can be any suitable pre-driver including any weak off-the-shelf pre-driver or amplifier. In some embodiments, the pre-driver 105 has small power consumption (e.g., a 1.4 W pre-driver) with a 19 dB gain characteristic. In some embodiments, the pre-driver 105 with a rating of 1.4 W is sufficient to provide sufficient linearity gain and output power for the PA 107. In some embodiments, the pre-driver 105 is a RFCA8830 device from Qorvo.

The PA 107 amplifies the power level of analog signal from the pre-driver 105 and provides the amplified analog signal to the cable plant 109a according to the spectrum 110. The amplified analog signal from the PA 107 is subject to frequency selective attenuation at the cable plant 109a and has a flat spectrum 111 after being transmitted across the cable associated with the cable plant 109a. In some embodiments, the up-tilt provided by the digital up-tilt circuit 101 in the digital domain compensates for the entire frequency dependent loss of the cable such that the spectrum 111 is obtained. The PA 107 is any type of power amplification circuit and is an 18 W amplifier (e.g., a RFPD3580 by Qorvo) in some embodiments.

The system 100 provides significant advantages over conventional non-segmented transmission schemes. A conventional non-segmented transmission scheme requires a 1 W pre-amplifier, a 10 W interstage amplifier, and four 18 W PAs for four cable plants 109a-d for a total power consumption of 83 W. In contrast, the system 100 without the pre-driver 105 requires four 18 W PAs for four cable plants 109a-d for a total power consumption of 72 W, and the system 100 with the pre-driver 105 requires four 1.4 W pre-drivers and four 18 W PAs for four cable plants 109a-d for a total power consumption of 77.6 W which is 6.5% lower than the conventional segmented scheme. The component count and cost for the system 100 is less than the component count and cost for the conventional non-segmented scheme that includes three forward equalizers and three splitters in addition to the amplifiers discussed above. The system 100 achieves the above discussed power savings and component savings while utilizing separate DPD loops for each path 102a-d as explained with reference to FIG. 4 in some embodiments.

In some embodiments, the digital up-tilt circuit 101 does not provide all of the up tilt adjustment for the path 102a and the analog filter 120 is employed to provide an additional up-tilt adjustment in the analog domain as described below. The analog filter 120 is a passive filter (e.g., a linear equalizer) in the analog domain and has an insertion loss that is proportional to the amount of provided up-tilt in some embodiments. Accordingly, the provision of larger amounts of the total up-tilt adjustment for the path 102a by the digital up-tilt ciruit 101 and smaller amounts of up-tilt adjustment by the analog filter 120 results in less insertion losses in some embodiments. In some embodiments, the up-tilted spectrum 104 combined with adjustment by the analog filter 120 (applying a response 124) corresponds to the total desired up tilt for the path 102a such that the flat spectrum 111 is achieved. In some embodiments, the insertion loss for the analog filter 120 is 2.4 dB or less, and the analog filter provides 6 dB of passive up-tilt.

In some embodiments, the analog filter 120 is employed when the TX DAC 103 has insufficient dynamic range. The insufficient dynamic range prevents 100% digital implementation of up-tilt due to degrading signal to noise ratio (SNR) and NPR at the lower end of signal spectrum. When compensating for insufficient dynamic range of the TX DAC 103, the amount of analog or passive up-tilt needed can be limited to a much smaller amount compared to the total up-tilt required by the path 102a and therefore insertion loss introduced by the analog filter 120 can be tolerated without having to employ a very powerful preamp. In some embodiments, the TX DAC 103 has natural rolloff in its output frequency response (i.e. curved rolloff and not straight line rolloff). The natural rolloff is more gradual than single-pole resistor-capacitor (R-C) rolloff (e.g., due partly to the sync rolloff of a sampled circuit and due partly to complex switching of R-C network in the current steering class-A DAC). The natural roll off is compensated for with additional upward frequency shaping (e.g., Tilt-Compensation (TC) or TC filtering) in some embodiments. The additional upward frequency shaping is implemented by the filter 120 in the analog domain in some embodiments. For example, if the path 102a requires a 21 dB linear up-tilt adjustment for the output of the PA 107 and upwards frequency shaping across the signal band is required for a 4 dB rolloff in the TX DAC 103, the 21 dB linear up-tilt adjustment is applied by the digital up-tilt circuit 101 and the 4 dB TC adjustment is applied by the analog filter 120 for a total of a 25 dB adjustment applied across the path 102a.

In some embodiments, an additional digital filter circuit or the digital up-tilt circuit 101 can provide the upward frequency shaping in the digital domain. The TC adjustment can be implemented by providing an upward frequency shaping block with an appropriate shape of the frequency response. Implementing TC adjustment in the digital domain provides advantages because implementing TC adjustment in the analog domain can require an additional analog component that has an insertion loss. For example, when implemented in the analog domain, an increase gain and/or output power requirement of the pre-driver 105 is generally needed. However, implementing up-tilt and TC adjustments in the analog domain relieves demands on the finite dynamic range of the TX DAC 103.

Allocation of the total up-tilt between digital up-tilt circuit 101 and the analog filter 120 is a tradeoff between NPR performance and gain required from the pre-driver 105. Lower digital up-tilt results in improved NPR performance at lower frequencies but requires a larger external passive analog filter 120, which results in more insertion loss that are offset by the pre-driver 105.

The system 100 provides much better noise to power ratio (NPR) performance at higher frequencies due to higher signal power at the higher frequencies due to the digital up-tilt circuit 101. Table 1 below shows measured data for NPR performance measured at the output of the PA 107 for the system 100, for a conventional non-segmented system with all analog up-tilt, for a segmented system with all analog up-tilt, and for a segmented system using a digital up-tilt circuit. As shown in Table 1, the system 100 has the same or better NPR performance at all frequencies ranges with lower power consumption than the segmented system without the digital up-tilt circuit 101 and the non-segmented systems.

TABLE 1

Operating parameters for different transmission system architectures.

| Measurement | Conventional Non-Segmented with all analog up-tilt | Non-segmented with digital up-tilt filter | Conventional Segmented with all analog up-tilt Option 1 | System 100 (with pre-driver 105 and analog filter 120) Option 2 |
|---|---|---|---|---|
| NPR @ low-frequencies | Similar to Segmented Option 1 | Similar to Segmented Option 2 | 42.5 dB | 42.5 dB* |
| NPR @ mid-frequencies | Similar to Segmented Option 1 | Similar to Segmented Option 2 | 41.7 dB | 43.7 dB* |
| NPR @ high-frequencies | Similar to Segmented Option 1 | Similar to Segmented Option 2 | 40.5 dB | 45.2 dB* |
| Power Consumption | 83 W | 78-82 W** | 96.5 W | 77.6 W |
| Delta Power Consumption compared to Conventional Non-Segmented with all analog up-tilt | 0% (reference) | −1 to −6%** | 16% | −6.5% |

(*averaged over multiple measurements; **estimated).

Figure 3:
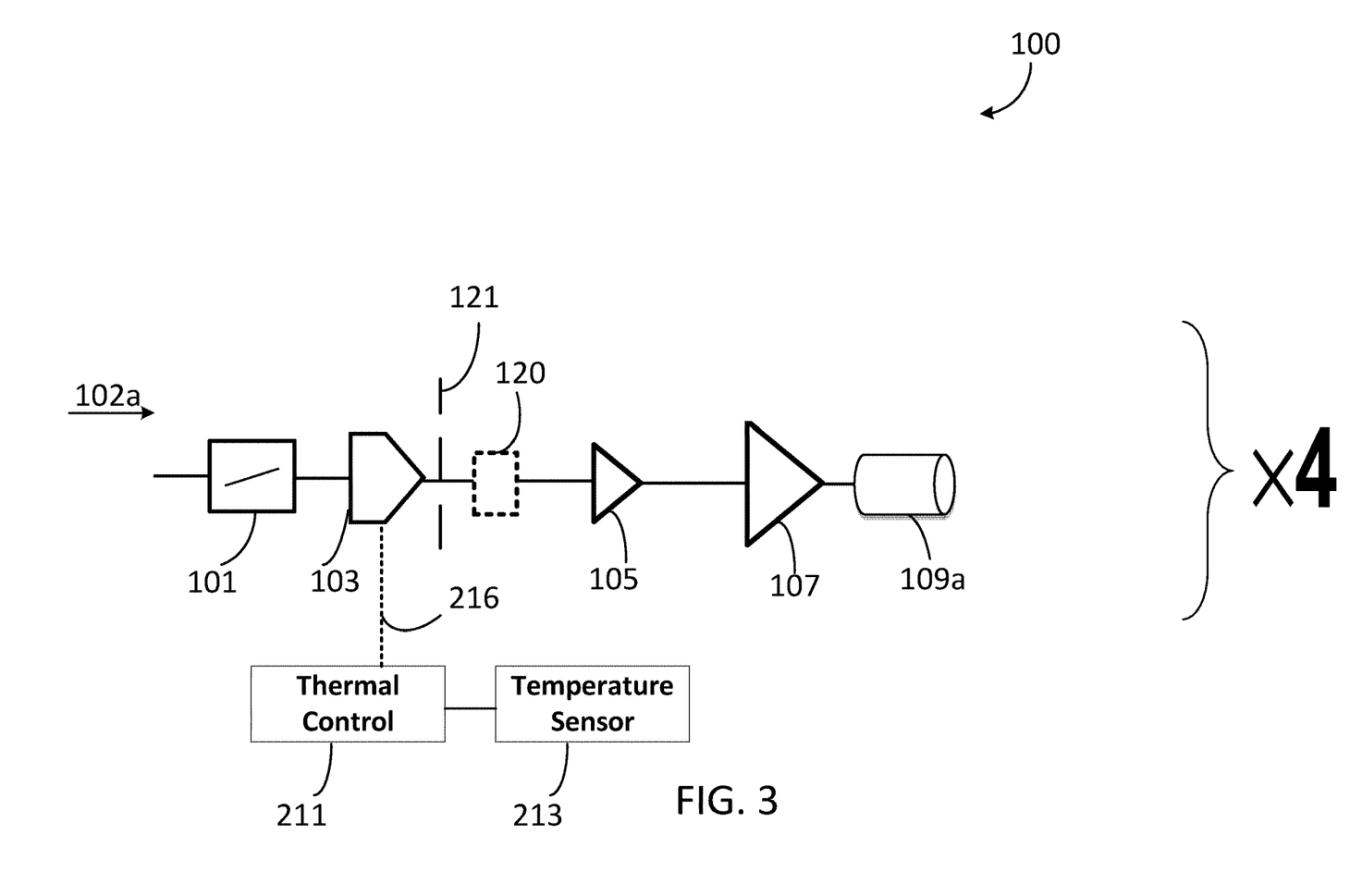
FIG. 3 is a schematic block diagram of a transmission path including a digital up-tilt circuit and a thermal control circuit for the segmented transmission system illustrated in FIG. 1 according to some embodiments.

With reference to FIG. 3, the path 102a includes a thermal control circuit 211 and a temperature sensor 213 in addition to the components discussed with reference to FIG. 1 according to some embodiments. The temperature sensor 213 monitors temperature within the system 100 (e.g., associated with components such as, the pre-driver 105, the PA 107 and the TX DAC 103) and transmits the temperature information to the thermal control circuit 211. In some embodiments, the temperature sensor 213 is a solid-state device (e.g., a diode-based circuit) that has a current characteristic responsive to temperature. The thermal control circuit 211 applies a temperature compensation in the digital domain to compensate for temperature variations. The temperature compensation is to compensate for a temperature dependent gain variation across the entire signal spectrum and across the entire transmit path up to the PA.

In some embodiments, the thermal control circuit 211 provides a gain adjustment control signal to the TX DAC 103. The communication of the gain adjustment control signal is represented by a dotted data signal line 216. The thermal control circuit 211 provides the gain adjustment to compensate for effects of heating in the system 100 (e.g., variation in the PA 107 and other circuit performance due to temperature) in some embodiments. The gain control signal can be a very fine gain control adjustment (e.g., a 20 bit gain adjustments) to minimize glitches in the output signal of the TX DAC 103. In some embodiments, the thermal control circuit 211 controls the bias current for the TX DAC 103 to compensate for effects of heating in the system 100 (e.g., variation in the PA 107 and other circuit performance due to temperature). By implementing temperature compensation in the digital domain, the gain/output requirement of the pre-driver 105 can be kept lower than if a temperature dependent passive attenuator is used for temperature compensation in some embodiments.

The thermal control circuit 211 includes a look-up table for adjustments based upon temperature in some embodiments. The thermal control circuit 211 can be implemented in hardware, and/or a combination of software and hardware in the digital domain. Temperature compensation in the digital domain does not incur insertion losses associated with analog temperature compensation schemes using temperature dependent passive attenuators. In some embodiments, the thermal control circuit 211 and temperature sensor 213 are provided in each of the paths 102c-d (FIG. 1).

Figure 4:
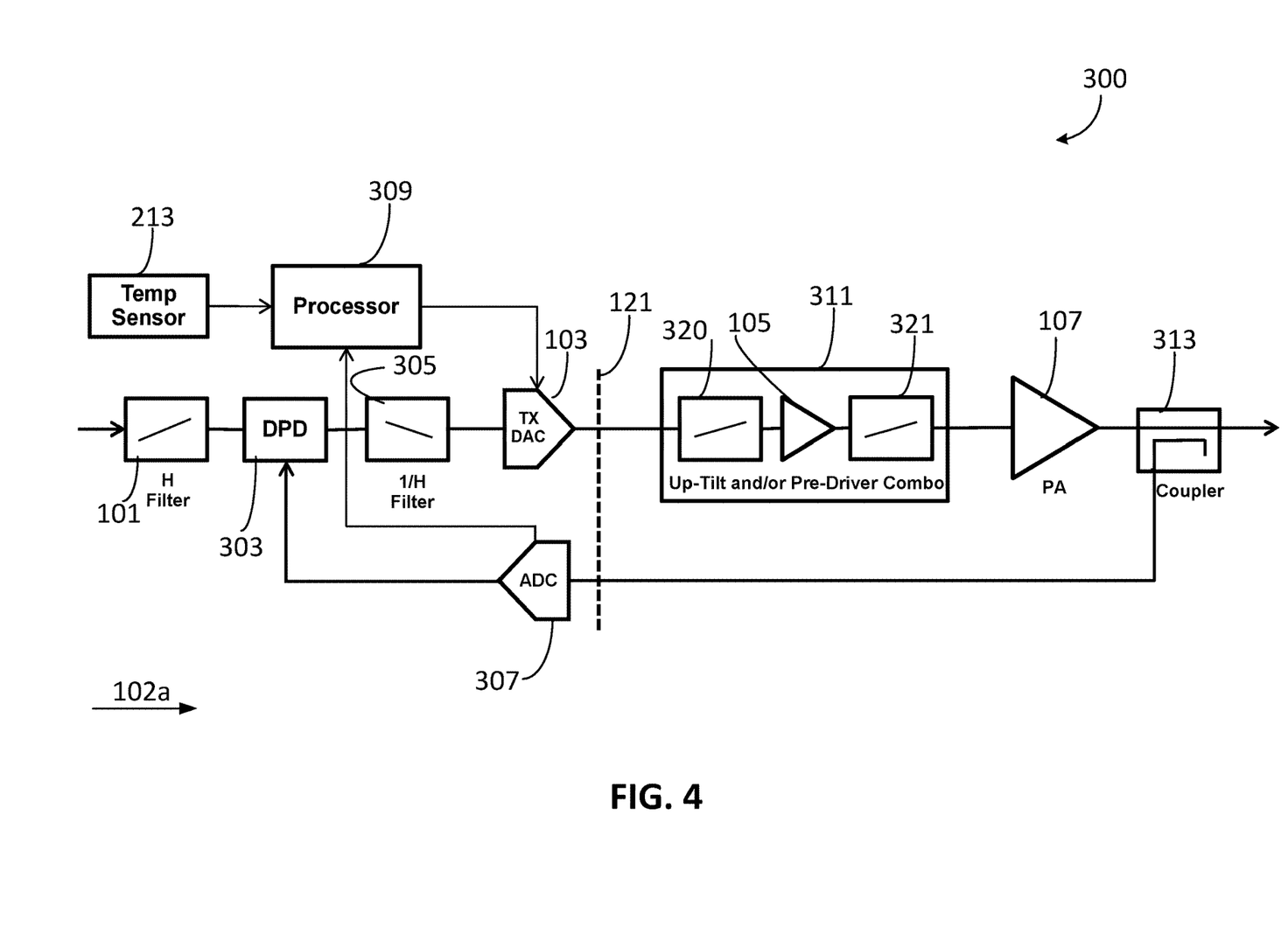
FIG. 4 is a schematic block diagram of a transmission path including a digital up-tilt circuit, a digital pre-distortion loop, and a temperature/power control for the segmented transmission system illustrated in FIG. 1 according to some embodiments.

With reference to FIG. 4, the path 102a includes a DPD circuit 303, a filter 305, an up-tilt and pre-driver combination circuit 311, a coupler 313, and an analog-to-digital converter (ADC) 307, in addition to the components discussed with reference to FIG. 1, according to some embodiments. In some embodiments, the DPD circuit 303 applies pre-distortion to the digital up-tilted signal to compensate for the nonlinear gain compression of the PA 107. The DPD circuit 303 modifies the pre-distortion according to a feedback signal from the coupler 313 at the output of the PA 107. The feedback signal from the coupler 313 is converted to a digital signal by the ADC 307 and received by the DPD circuit 303. The DPD circuit 303 performs digital signal processing to control the application of the pre-distortion. In some embodiments, the DPD circuit 303 is implemented in hardware, and/or a combination of software and hardware (e.g., a digital signal processor executing a program) in the digital domain.

The up-tilt and/or pre-driver combination circuit 311 includes the pre-driver 105 and analog filters 320 and 321. The analog filters 320 and 321 can be a single filter or two separate filters. In some embodiments, the analog filters 320 and 321 provide a combined 6 dB of up-tilt and TC and can be similar to the analog filter 120 discussed with reference to FIG. 2. In some embodiments, the analog filters 320 and 321 are optional and the pre-driver 105 is optional. The filters 320 and 321 can be provided as shown with respect to the pre-driver 105 or can be provided before or after the pre-driver 105.

The filter 305 is a 1/H digital filter that equalizes the response H of the combined tilt of the filters 320 and 321 including the TX DAC performance. The TX DAC performance affects tilt due to the non-ideal nature of the TX DAC 103 (e.g., not an intentional frequency shaping). The digital up-tilt circuit 101 provides an amount of tilt of 22 dB, the 1/H filter provides an amount of tilt of −2 dB, the TX DAC has an amount of tilt of −4 dB (e.g., natural roll off), and the analog filters 320 and 321 provide an amount of tilt of 6 dB for a total amount of tilt of 22 dB. Advantageously, the 1/H digital filter nulls out the tilt of the analog filters 320 and 321 and the TX DAC which are in the DPD control loop in some embodiments. Providing net up-tilt in the DPD loop increases the complexity of the DPD circuit 303 (e.g., by requiring more elements and memory).

The system 300 provides a total up-tilt of 22 dB in some embodiments. In contrast, a conventional non-segmented scheme does not include the circuit 101 and the filter 305 and provides 26 dB of tilt using an analog linear equalizer for a total up tilt of 22 DB when the TX DAC 103 roll off is included.

In some embodiments, the path 102a includes an optional processor 309 and the temperature sensor 213. In some embodiments, the temperature sensor 213 measures a temperature of the system and provides the temperature information to the processor 309. The processor 309 provides the gain adjustment to compensate for effects of heating in the system 300 in a similar fashion as discussed with reference to FIG. 3.

In some embodiments, the ADC 307 provides a feedback signal related to the power level of the output signal from the PA 107. The ADC 307 converts the feedback signal to a digital signal as feedback for the processor 309. In some embodiments, the processor 309 adjusts the bias current of the TX DAC 103 or provides the gain adjustment based on a power level of the feedback signal to provide temperature compensation across the entire signal band and across the entire transmit path up to the PA. With such a system, the temperature sensor 213 is not utilized.

Figure 5:
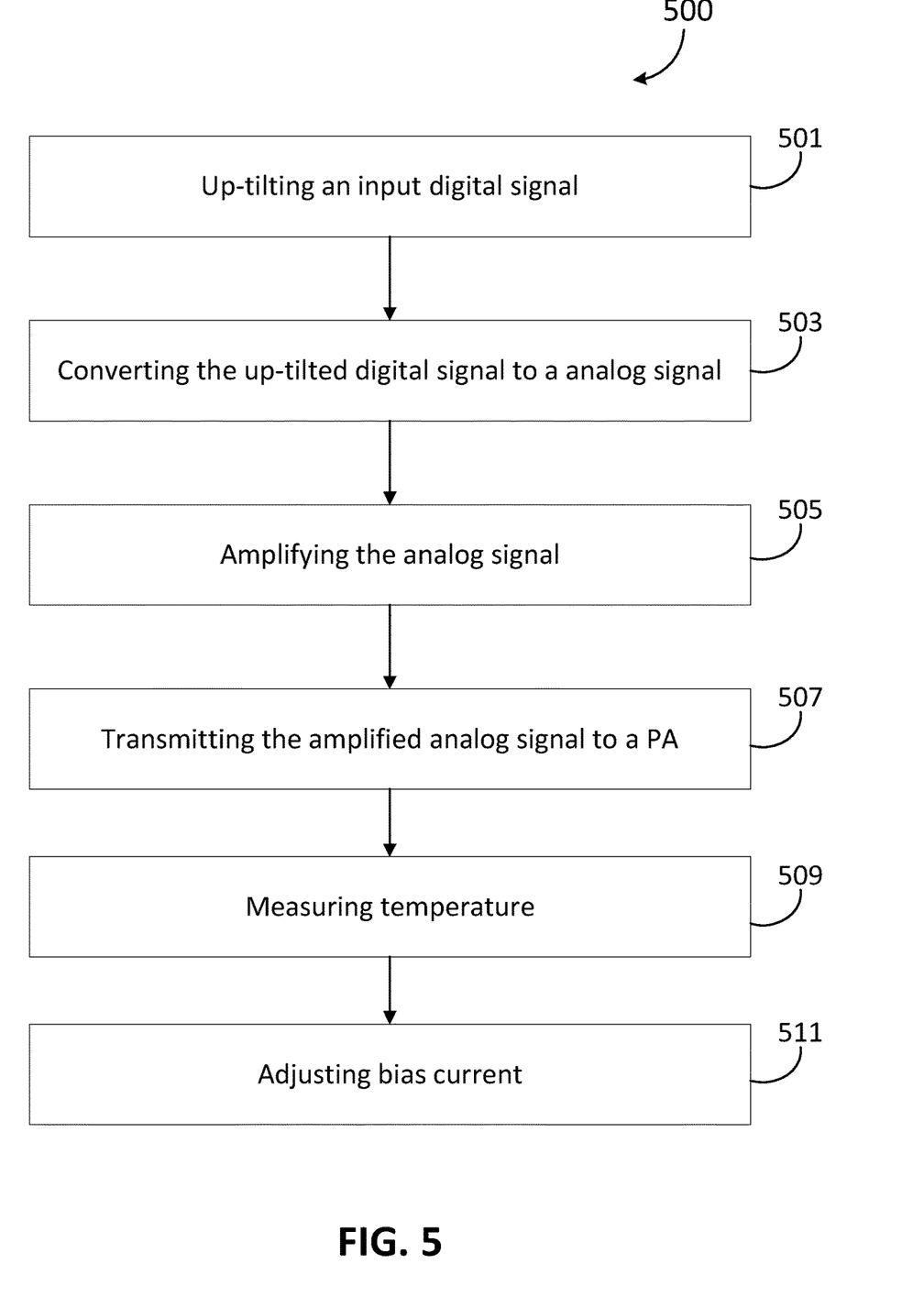
FIG. 5 is a flow diagram of operations for providing cable headend transmission according to some embodiments

With respect to FIG. 5, a flow 500 of operations for providing cable headend transmission is shown according to some embodiments. At an operation 501, an input digital signal is up-tilted from a flat spectrum to an up-tilted spectrum according to some embodiments. The up-tilt operation is implemented in the digital domain according to some embodiments. In some embodiments, the up-tilt applied in the digital domain is the total required up-tilt for a PA to compensate for frequency dependent signal loss across the cable.

At an operation 503, the up-tilted digital signal is transmitted into a TX DAC according to some embodiments. The TX DAC converts the digital signal into an analog signal according to some embodiments. The output analog signal of the TX DAC has the total up-tilt according to some embodiments.

At an operation 505, the output analog signal is provided to a pre-driver according to some embodiments. The pre-driver amplifies the analog signal so that the power level is enough for driving a PA that is connected to the pre-driver according to some embodiments. In some embodiments, the input and/or output analog signal is subjected to analog filtering for TC and/or additional up-tilt adjustment.

At an operation 507, the up-tilted signal is provided to the PA according to some embodiments. The PA amplifies the signal and outputs a signal to be transmitted to the cable plant through the cable according to some embodiments.

At an operation 509, a temperature of one or more components (e.g., the PA) that conduct in the transmission path is measured using one or more temperature sensors according to some embodiments. In some embodiments, the temperature information is transmitted to a thermal control circuit.

At operation 511, the thermal control circuit causes adjustments to be made to compensate for thermal characteristics of the transmission path (e.g., variation in the PA and other circuit performance due to temperature). A digital filter, a TX DAC gain adjustment or a DAC bias current adjustment can be used to compensate of the thermal characteristics. In some embodiments, a DPD technique can be utilized in flow 500 to compensate for distortion.

The disclosure is described above with reference to drawings. These drawings illustrate certain details of specific embodiments that implement the systems and methods and programs of the present disclosure. However, describing the disclosure with drawings should not be construed as imposing on the disclosure any limitations that are present in the drawings. No claim element herein is to be construed as a "means plus function" element unless the element is expressly recited using the phrase "means for." Furthermore, no element, component or method step in the present disclosure is intended to be dedicated to the public, regardless of whether the element, component or method step is explicitly recited in the claims.

It should be noted that certain passages of this disclosure can reference terms such as "first" and "second" in connection with power level for purposes of identifying or differentiating one from another or from others. These terms are not intended to relate entities or operations (e.g., a first power level and a second power level) temporally or according to a sequence, although in some cases, these entities can include such a relationship. Nor do these terms limit the number of possible entities or operations.

It should be noted that although the flowcharts provided herein show a specific order of method steps, it is understood that the order of these steps can differ from what is depicted. Also, two or more steps can be performed concurrently or with partial concurrence. Such variation will depend on the software and hardware systems chosen and on designer choice. It is understood that all such variations are within the scope of the disclosure.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A segmented system for cable transmission, comprising:
a plurality of paths, each of the plurality of paths comprising:
an up-tilt circuit configured to receive an input digital signal that has a flat spectrum and generate an up-tilted digital signal that has an up-tilted spectrum;
a digital-to-analog converter configured to receive the up-tilted digital signal and to provide an analog signal; and
a power amplifier configured to receive the analog signal and amplify the analog signal for cable transmission, wherein the analog signal is not further up-tilted in an analog domain between the digital-to-analog converter and the power amplifier.

2. The system of claim 1, further comprising a pre-driver configured to amplify the analog signal from a first power level to a second power level.

3. The system of claim 2, wherein the pre-driver consumes a small amount of power.

4. The system of claim 1, wherein the up-tilt circuit is configured to generate the up-tilted digital signal by up-tilting the input digital signal with a total required up-tilt.

5. The system of claim 4, wherein each path of the plurality of paths terminates at a cable plant, and the total required up-tilt is determined according to a frequency-dependent signal loss at the cable plant and frequency roll-off at the digital-to-analog converter.

6. The system of claim 2, wherein the second power level meets a power required by the power amplifier.

7. The system of claim 1, wherein each of the plurality of paths further comprises a digital pre-distortion (DPD) circuit configured to apply a pre-distortion to the up-tilted digital signal.

8. The system of claim 7, wherein the DPD circuit receives a feedback signal from an output of the power amplifier and is configured to modify the pre-distortion to the up-tilted digital signal in response to the feedback signal.

9. The system of claim 2, wherein the pre-driver is a 1.4 Watt or less pre-driver.

10. A device for cable transmission, comprising:
an up-tilt circuit configured to receive an input digital signal that has a flat spectrum and generate an up-tilted digital signal that has an up-tilted spectrum;

a digital pre-distortion (DPD) circuit configured to apply a pre-distortion to the up-tilted digital signal;

a digital-to-analog converter configured to receive the up-tilted digital signal and to provide an analog signal;

an analog filter configured to receive the analog signal, compensate for a roll off characteristic of the digital-to-analog converter, and provide a filtered signal, wherein the analog filter has an insertion loss of less than 2.5 dB and the up-tilt circuit and the analog filter provide a combined up-tilt response for an entire transmission path of the device;

a pre-driver configured to amplify the filtered signal and provide a pre-driven signal, the pre-driver having a gain of less than 20 dB; and a power amplifier configured to receive the pre-driven signal and amplify the pre-driven signal for transmission via a cable.

11. The device of claim 10, wherein the pre-driver consumes a small amount of power.

12. The device of claim 11, wherein the pre-driver consumes 1.5 Watts or less of power.

13. The device of claim 10, wherein the up-tilt circuit provides 20 dB of up-tilt in a digital domain.

14. The device of claim 13, further comprising:
a thermal compensation system comprising a temperature sensor and a thermal control circuit configured to adjust a bias current of the digital-to-analog converter in response to temperature.

15. The device of claim 10, wherein the DPD circuit receives a feedback signal from an output of the power amplifier and is configured to modify the pre-distortion to the up-tilted digital signal.

* * * * *